US008526537B2

(12) United States Patent
Chen et al.

(10) Patent No.: US 8,526,537 B2
(45) Date of Patent: Sep. 3, 2013

(54) DIGITAL PRE-DISTORTION PROCESSING METHOD AND APPARATUS

(75) Inventors: Dong Chen, Beijing (CN); Yuemin Cai, Beijing (CN); Shaoli Kang, Beijing (CN)

(73) Assignee: China Academy of Telecommunications Technology, Beijing (CN)

( * ) Notice: Subject to any disclaimer, the term of this patent is extended or adjusted under 35 U.S.C. 154(b) by 0 days.

(21) Appl. No.: 13/581,070

(22) PCT Filed: Feb. 16, 2011

(86) PCT No.: PCT/CN2011/000242
§ 371 (c)(1),
(2), (4) Date: Aug. 24, 2012

(87) PCT Pub. No.: WO2011/103767
PCT Pub. Date: Sep. 1, 2011

(65) Prior Publication Data
US 2012/0321018 A1    Dec. 20, 2012

(30) Foreign Application Priority Data

Feb. 25, 2010 (CN) .......................... 2010 1 0114993

(51) Int. Cl.
H04L 25/03    (2006.01)
(52) U.S. Cl.
USPC .......................................................... 375/297
(58) Field of Classification Search
USPC ................................................. 375/295–297
See application file for complete search history.

(56) References Cited

U.S. PATENT DOCUMENTS

| 7,203,247 | B2* | 4/2007 | Bauder et al. ................. 375/296 |
| 2003/0197558 | A1* | 10/2003 | Bauder et al. ................. 330/149 |
| 2004/0252784 | A1* | 12/2004 | Honcharenko et al. ....... 375/297 |
| 2008/0130789 | A1* | 6/2008 | Copeland et al. .............. 375/297 |
| 2010/0308910 | A1* | 12/2010 | Barnes .......................... 330/149 |

FOREIGN PATENT DOCUMENTS

| CN | 1585264 A | 2/2005 |
| CN | 101364829 A | 2/2009 |

* cited by examiner

Primary Examiner — Kevin M Burd
(74) Attorney, Agent, or Firm — Kilpatrick Townsend & Stockton LLP

(57) ABSTRACT

This invention discloses a for digital pre-distortion processing method and apparatus, the method including that: training signals are sent to at least one radio frequency front-end device as needed (201); the output training signals of the radio frequency front-end devices are collected through a feedback channel as needed (202); digital pre-distortion (DPD) coefficients of the radio frequency front-end devices are trained as needed (203); after the coefficient training is completed, the DPD coefficients of the corresponding radio frequency front-end devices are updated as needed. There is no need to track the variation of the signals all the time and to compare the signals with a long-time statistical signal template to trigger the training in the invention. The invention can accommodate a multi-antennas application without configuring a corresponding digital pre-distortion feedback channel and coefficient training module separately for each antenna, thereby when the antennas are increased, the volume and cost are not increased and the invention can be of good feasibility from the perspective of commercialization.

20 Claims, 8 Drawing Sheets

DIGITAL PRE-DISTORTION PROCESSING METHOD AND APPARATUS

The present application is a US National Stage of International Application No. PCT/CN2011/000242, filed 16 Feb. 2011, designating the United States, and claiming priority to Chinese Patent Application No. 201010114993.7 filed Feb. 25, 2010.

FIELD OF THE INVENTION

The present invention relates to the field of radio communications and particularly to a digital pre-distortion processing method and apparatus.

BACKGROUND OF THE INVENTION

Nonlinear responses of the majority of power amplifiers are not ideal due to influences of devices and an environment, thus resulting amplitude and phase distortion of in-band and out-of-band signals. Particularly a wideband multi-carrier wireless communication system being currently in active development and ready to be put into commercial use requires higher linearity and efficiency of a radio frequency power amplifier than a narrowband single-carrier system. The following problems of an application of a power amplifier result from the current development of 3G and 4G technologies.

1. Linearity of a wideband power amplifier is seriously deteriorated due to high transmission power, thus directly resulting in a deteriorated Error Vector Magnitude (EVM) of an in-band signal and exacerbated out-of-band interference, and a current test shows that interference power of an adjacent channel approximates to 0 dBm and an Adjacent Channel Leakage power Ratio (ACLR) of the adjacent channel and a next adjacent channel is about 35 dBc at rated transmission power of 43 dBm in the frequency band of 20.10 MHz to 2025 MHz, which is too far from an index of 45 dBc of a next adjacent channel stipulated by the $3^{rd}$ Generation Partnership Project (3 GPP) to satisfy the requirement of the 3GPP.

2. A bandwidth of a signal constantly increases due to multi-carrier applications (9 carriers, 12 carriers and even more carriers), and also a peak to average power ratio of a transmission signal becomes very high due to applications of various complex modulation modes, e.g., 16-Quadrature Amplitude Modulation (16QAM), 64QAM, Orthogonal Frequency Division Multiplexing (OFDM), etc. A 12-carrier application of a Time Division-Synchronous Code Division Multiple Access (TD-SCDMA) system has a peak to average power ratio up to 16-17 dB which is limited to just roughly 9.5 dB even with phase rotation, and there is a peak to average power ratio of roughly 10 dB for Long Term Evolution-Time Division Duplex (LTE-TDD). If a linear characteristic of a power amplifier is ensured only with a power back-off, then the efficiency of the power amplifier will become very low, typically below 10%, and the absence of the power back-off will introduce so great nonlinear distortion that a receiver can not demodulate any signal.

3. A green base station requires an increase in the efficiency of a power amplifier from past 10% below to 30% above with the efficiency of a system also above 20%, and a study of existing envelop tracking and other technologies shows potential efficiency of a system above 40%.

The foregoing problems inspire a demand for a technology to increase the efficiency of a power amplifier, and there is an inherent contradiction between the linearity and efficiency of a power amplifier. If it is desired to address the foregoing problems only with an improvement of power amplifier technologies and processes, then existing devices might hardly have been satisfactory. Thus it is very curial to improve a linearity characteristic of a power amplifier while ensuring the efficiency thereof with the existing power amplifier technologies. The technology of Digital Pre-Distortion (DPD) is one of the most effective power amplifier linearization technologies to address the contradiction, and it compensates nonlinearity of a power amplifier effectively in the digital domain with existing powerful signal processing technologies to provide an output signal at greater power while reducing the volume, power consumption and cost of an apparatus.

FIG. 1 is a schematic diagram of a general digital pre-distortion solution, and a currently common DPD solution is as illustrated in FIG. 1. An input Inphase/Quadrature (I/Q) signal passes a Digital Up-Converter (DUC) and undergoes multi-carrier aggregation and then peak to average power ratio suppression (e.g. Crest Factor Reduction, CFR with a crest factor being equal to the square root of a peak to average power ratio), and then a transmission signal undergoes a pre-distortion process, passes a Digital-to-Analogue Converter (DAC) and undergoes carrier modulation and then enters a Power Amplifier (PA) generating through coupling an output signal of the power amplifier, which is transmitted back to the digital pre-distorting module over a feedback channel. Pre-distortion performance is greatly influenced by both a bit width and a sampling bandwidth of an Analogue-to-Digital Converter (ADC) of the feedback channel, and the digital pre-distorting module keeps making a statistic of a characteristic of the signal and will not start to train coefficients until an appropriate signal is found. A signal can be selected on such a criterion as a dynamic range, a peak to Average Power Ratio (PAPR), power, amplitude, a phase and other characteristic of the signal, possibly also in combination with a frame structural characteristic (e.g., including a special timeslot) or a specific transmission design.

In some cases, there is a regular characteristic of a signal in the time domain, and then parameters can be estimated periodically with a specific segment of the signal. At this time it is not necessary to make a statistic of the signal but instead acquisition of data is triggered with an external trigger signal, and for example, in a Time Division Duplex (TDD) frame structure of Worldwide interoperability over Microwave Access (WiMAX) based upon the technology of Orthogonal Frequency Division Multiplexing (OFDM), it is recognized that the part of a preamble is at high power and there is a significant signal range after CFR, so good options of samples for estimating parameters are possible. If such a characteristic in the time domain is absent with the signal, then samples are acquired randomly and a signal is decided, and no parameter will be estimated until qualified samples are acquired, thereby ensuring correction of all of estimated parameters.

Digital pre-distortion is performed in the prior art primarily based upon dynamical tracking of a change in a signal, and this method works well for a single-antenna application because a DPD coefficient training module is dedicated to the channel and can track in real time a change in the signal and thus compensate in a timely manner distortion resulting from nonlinearity of a power amplifier.

Unfortunately this method has the following at least two drawbacks: one drawback lies in that it has to operate in real time because it is unknown that whether the signal can be used to train coefficients and thus a change in the signal has to be tracked all the time and compared with a signal template resulting from a long-term statistic to trigger training, thus posing another constraint on essentially insufficient digital intermediate-frequency resources; and the other drawback lies in that each antenna has to be configured separately with a corresponding DPD feedback channel and coefficient training module so as to accommodate a multi-antenna application, and this will greatly increase the volume and cost of an apparatus along with the increasing number of antennas, thus resulting in poor feasibility from the perspective of commercialization.

Furthermore in the WiMAX system based upon the technology of OFDM, although there is high transmission power of a downlink preamble signal, boosted carrier power is supported in a data zone and thus the power of a real transmission signal of the preamble may not necessarily be the highest; and also the peak-to-average ratio of the preamble below 5 dB is too low to satisfy a requirement on a training signal for digital pre-distortion; and neither broadcast channel nor Downlink Pilot Time Slot (DwPTS) signal of TD-SCDMA accommodates a required characteristic of the training signal, so a specific signal has to be considered for DPD coefficient training.

SUMMARY OF THE INVENTION

The invention addresses a technical problem of providing a digital pre-distortion processing method and apparatus.

An embodiment of the invention provides a digital pre-distortion processing method, which includes the steps of:

transmitting a training signal into at least one radio frequency front-end device as needed;

acquiring the output training signal of the radio frequency front-end device over a feedback channel as needed;

training DPD coefficients of the radio frequency front-end device as needed; and updating the DPD coefficients of the corresponding radio frequency front-end device as needed upon completion of training the DPD coefficients.

An embodiment of the invention provides a digital pre-distortion processing apparatus, which includes:

a training signal module configured to transmit a training signal into at least one radio frequency front-end device as needed;

an acquiring module configured to acquire the output training signal of the radio frequency front-end device over a feedback channel as needed;

a training module configured to train DPD coefficients of the radio frequency front-end device as needed; and an updating module configured to update the DPD coefficients of the corresponding radio frequency front-end device as needed upon completion of updating the coefficients.

Advantageous effects of the invention are as follows:

In the technical solution of the invention, since a training signal is generated specifically for training DPD coefficients and it can be transmitted as needed or periodically or non-periodically, no real time operation is required, and it is not necessary to track a change in the signal all the time and to compare it with a signal template resulting from a long-term statistic to trigger training.

Since a radio frequency front-end device typically can include a single radio frequency channel, a plurality of radio frequency channels or a set of a plurality of RRUs, a training signal is transmitted into at least one radio frequency front-end device as needed, and the output training signal of the radio frequency front-end device is acquired over a feedback channel as needed, so that DPD coefficients of respective channels of the corresponding radio frequency front-end device can be updated as needed after the DPD coefficients of the radio frequency front-end device are trained, thereby accommodating a multi-antenna application without configuring each antenna separately with a corresponding DPD feedback channel and coefficient training module and consequentially without increasing the volume and the cost of an apparatus despite the increased number of antennas, and the invention can be of good feasibility from the perspective of commercialization.

DETAILED DESCRIPTION OF THE EMBODIMENTS

Embodiments of the invention will be described below with reference to the drawings.

Figure 1:
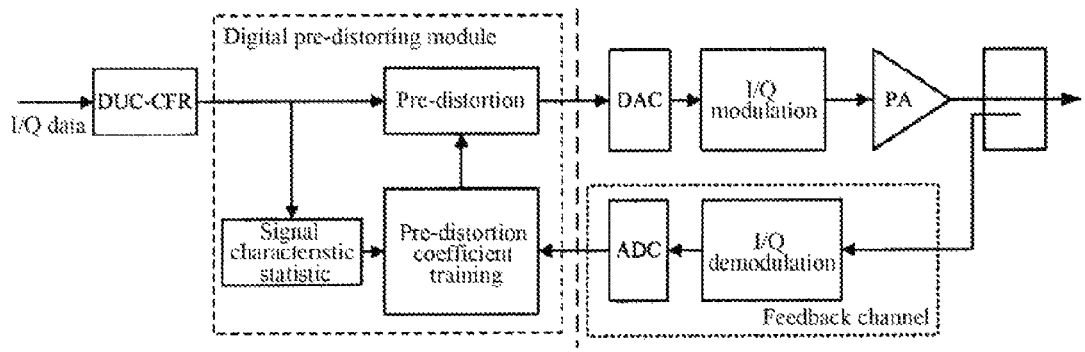
FIG. 1 is a schematic diagram of a general digital pre-distortion solution in the prior art.
Figure 2:
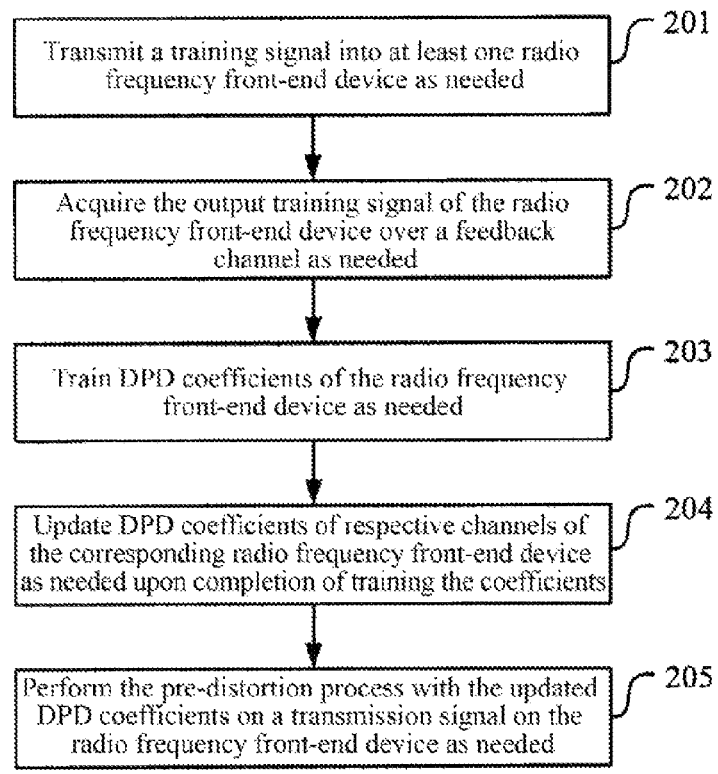
FIG. 2 is a schematic flow chart of a digital pre-distortion processing method according to an embodiment of the invention.

FIG. 2 is a schematic flow chart of a digital pre-distortion processing method according to an embodiment of the invention, and as illustrated, a digital pre-distortion process can include the following steps:

Step 201: transmitting a training signal into at least one radio frequency front-end device as needed.

In a specific implementation, a Radio Remote Unit (RRU) can be adopted for the radio frequency front-end device, but the RRU is defined based upon the architecture of an existing commercial base station and is a common concept in the industry. The RRU is only one of various kinds of radio frequency front-end devices because the radio frequency front-end device can be a single radio frequency channel, a set of a plurality of radio frequency channels, a set of a plurality of RRUs, etc. For convenient understanding, the following embodiments will be described primarily taking an RRU as an example, and furthermore each radio frequency channel can include a power amplifier device.

In a specific implementation, the training signal can be a training signal pre-generated and stored in a communication system or, of course, can alternatively be generated as needed and then transmitted.

In a specific implementation, the training signal can be transmitted as needed or periodically or non-periodically.

Step 202: acquiring the output training signal of the radio frequency front-end device over a feedback channel as needed;

Step 203: training DPD coefficients of the radio frequency front-end device as needed; and Step 204; updating the DPD coefficients of respective channels of the corresponding radio frequency front-end device as needed upon completion of training the coefficients.

Furthermore there can further be included in the embodiment:

Step 205: performing the pre-distortion process with the updated DPD coefficients on a transmission signal on the radio frequency front-end device as needed.

In the foregoing embodiment, the step 201 can further include:

A pre-distortion process, that is, the transmitted training signal undergoes an initial pre-distortion process and then is transmitted into the at least one radio frequency front-end device.

In an implementation, transmission of the training signal into the at least radio frequency front-end device, acquisition of the output training signal of the radio frequency front-end device, training of the DPD coefficients of the radio frequency front-end device and updating of the DPD coefficients of the respective channels of the corresponding radio frequency front-end device can be performed as needed because such a situation may occur in some cases that there is no need of training for a certain radio frequency front-end device (e.g., an RRU). In the case of highly controlling the quality of a product, for example, available estimated coefficients for a certain RRU can be derived directly from a configuration condition of another RRU. In another example, in the case of a power amplifier with good consistency resulting from an application of gallium nitride (GaN) and a new semiconductor process and even a Micro-Electro-Mechanical System (MEMS), it is not necessary to train for a certain RRU, and even coefficients for the entire product corresponding to different application scenarios can simply be customized upon shipping from a factory. Therefore in an implementation, a corresponding process can be performed on the radio frequency front-end device to be implemented as needed in practice.

For updating of the DPD coefficients of the respective channels of the corresponding radio frequency front-end device, reference can be made to the following signal flow chart of a DPD algorithm.

Figure 3:
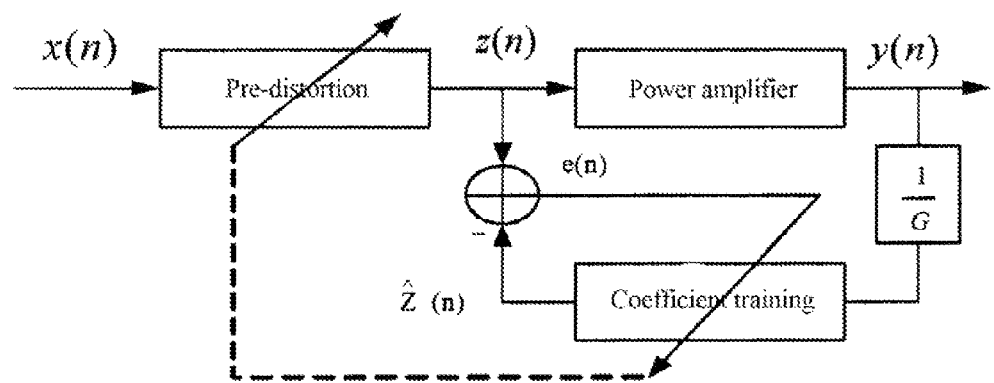
FIG. 3 is a schematic a signal flow chart of a DPD algorithm according to an embodiment of the invention.

FIG. 3 is a schematic signal flow chart of a DPD algorithm, and as illustrated, given a training sequence length of N, a memory depth of Q and an cross-modulation order of K, and then:

(1) The following relationship holds between a signal z(n) resulting from a pre-distortion process on a transmission signal x(n) and an output signal of a power amplifier (a feedback signal):

$$z(n) = \sum_{\substack{k=2l-1 \\ l=1,2,\ldots,\lfloor(K+1)/2\rfloor}}^{K} \sum_{q=0}^{Q} a_{k,q} y(n-q)|y(n-q)|^{k-1} \quad (1)$$

(2) In order to maintain power balance, a rated linear gain G of the power amplifier shall be removed from the feedback signal y(n), thus resulting in a signal $u_{k,q}(n)$:

$$u_{k,q}(n) = \frac{y(n-q)}{G}\left|\frac{y(n-q)}{G}\right|^{k-1} \quad (2)$$

(3) The foregoing signals are represented by matrixes as follows:

The feedback signal:

$$U=[u_{10},\ldots u_{K0},\ldots u_{1Q},\ldots u_{KQ}], u_{kq}=[u_{kq}(0),\ldots u_{kq}(N-1)]^T \quad (3)$$

The reference signal:

$$z=Ua, z=[z(0),\ldots,z(N-1)]^T \quad (4)$$

Target DPD coefficients:

$$a=[a_{10},\ldots a_{K0},\ldots a_{1Q},\ldots a_{KQ}]^T \quad (5)$$

(4) A least square solution of estimated target DPD coefficients â is represented as follows:

$$\hat{a}=(U^H U)^{-1} U^H z \quad (6)$$

(5) Cholesky decomposition results in $(U^H U)^{-1}$, and let $R=U^H U$:

$$g_{ij} = \begin{cases} \left(r_{ii} - \sum_{k=1}^{i-1} g_{ik} g_{ik}^*\right)^{\frac{1}{2}}, & i=j \\ \frac{1}{g_{jj}}\left(r_{ij} - \sum_{k=1}^{j-1} g_{ik} g_{jk}^*\right), & i>j \\ 0, & i<j \end{cases} \quad (7)$$

Let $g_{11}=\sqrt{r_{11}}$, where $g_{ij}$ is an element in the $i^{th}$ row and in the $j^{th}$ column of G, and $r_{ij}$ is an element in the $i^{th}$ row and in the $j^{th}$ column of R, and given $B=G^{-1}$, then $$b_{ij} = \begin{cases} \frac{1}{g_{ij}} & i=j \\ -\frac{1}{g_{ii}}\sum_{k=j}^{i-1} g_{ik} b_{kj} & i>j \\ 0 & i<j \end{cases} \quad (8)$$

$b_{ij}$ is an element in the $i^{th}$ row and in the $j^{th}$ column of B, and then:

$$R^{-1}=B^H B \quad (9)$$

The estimated target DPD coefficients â can be derived simply by substituting into Equation (7).

Figure 4:
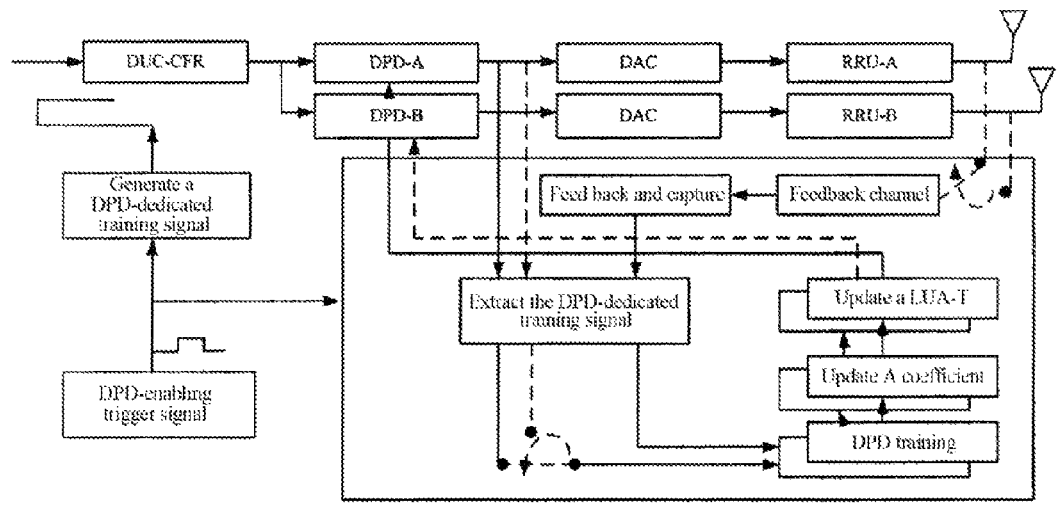
FIG. 4 is a schematic principle diagram of a digital pre-distortion process solution based upon a training sequence according to an embodiment of the invention.

FIG. 4 is a schematic principle diagram of a digital pre-distortion process solution based upon a training sequence, and this figure presents a schematic principle of a two-channel (antenna) DPD solution applicable to TD-SCDMA or LTE-TDD (Long Term Evolution-Time Division Duplex).

Evidently this solution can be extended to any antenna configuration, and as illustrated, a brief introduction thereof is as follows:

To start a digital pre-distortion process, the process is triggered by a DPD-enabling trigger signal so that a DPD-dedicated training signal in the step 201 is generated, then passes a DUC and undergoes CFR, then enters respectively pre-distortion processes DPD-A and DPD-B of an RRU-A and an RRU-B, then passes a DAC and undergoes carrier modulation, and then enters a power amplifier generating through coupling an output signal of the power amplifier, which is transmitted respectively through the RRU-A and the RRU-B, i.e., the step 201; then the signal passes a feedback channel and is fed back and captured to extract the DPD-dedicated training signal, i.e., the step 202; DPD training of the step 203 is performed to update a Look Up Table (LUT) after coefficients are updated; and then DPD coefficients of respective channels of the corresponding RRUs are updated, i.e., the step 204. The coefficients can be updated by updating the DPD coefficients of the RRU-A and the RRU-B sequentially or concurrently as needed.

For a better understanding of how to put the invention into practice, the invention will be described below with reference to FIG. 4, and a training signal is generated after being triggered by an enabling signal in a first embodiment and pre-generated and -stored in a communication system in a second embodiment.

First Embodiment

Figure 5:
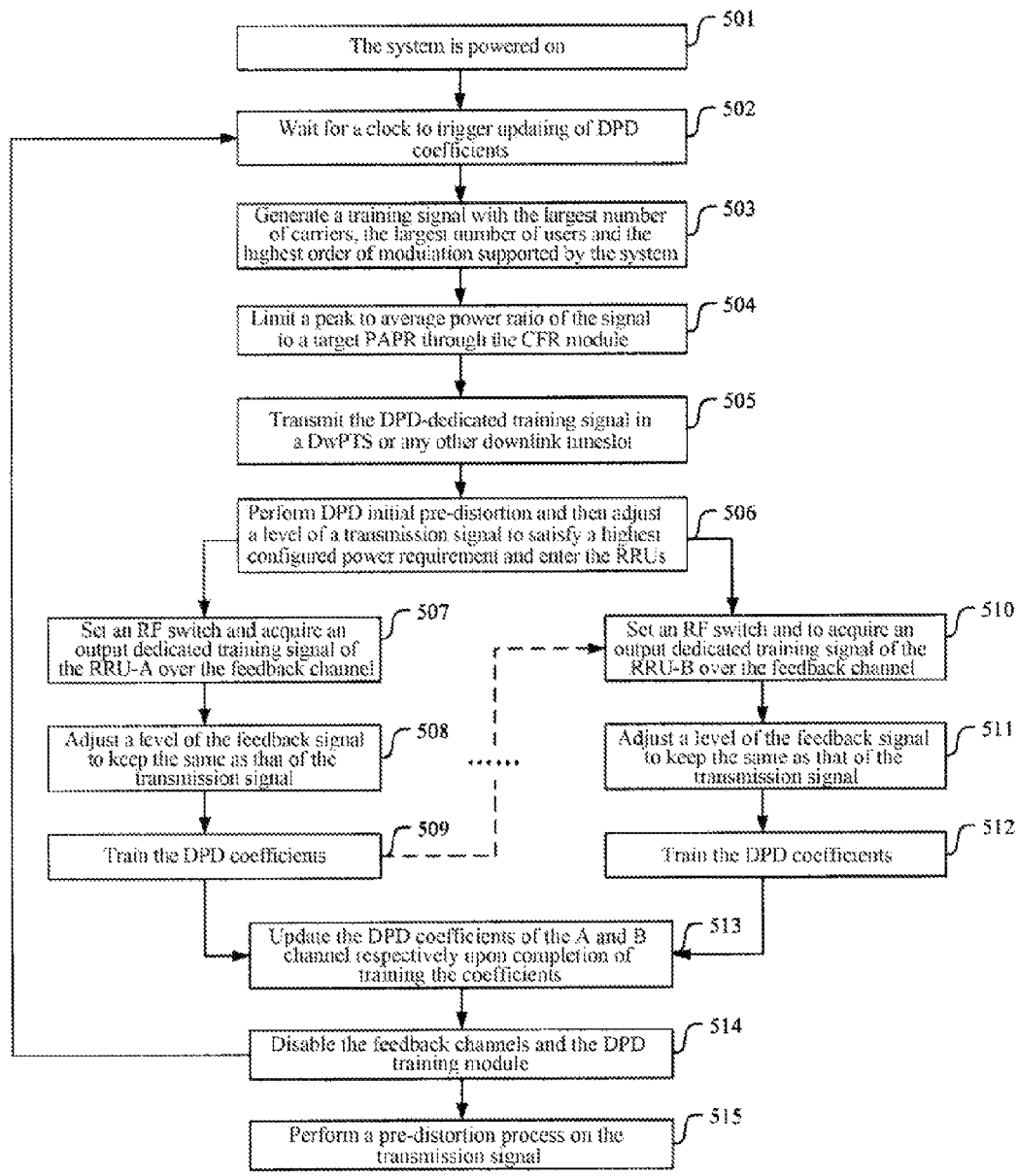
FIG. 5 is a schematic flow chart of performing a digital pre-distortion process according to a first embodiment of the invention.

FIG. 5 is a schematic flow chart of performing a digital pre-distortion process according to a first embodiment of the invention, and as illustrated, the process can include:

In the step 501, the system is powered on.

The step 502 is to wait for a clock to trigger updating of DPD coefficients.

The step 503 is to generate a training signal with the largest number of carriers, the largest number of users and the highest order of modulation supported by the system.

The step 504 is to limit a Peak to Average Power Ratio of the signal to a target PAPR through the CFR module.

The step 505 is to transmit the DPD-dedicated training signal, i.e., the training signal which has been processed in the step 504, in a DwPTS or any other normal downlink timeslot.

The step 506 is to perform an initial DPD, i.e., an initial pre-distortion process, then adjust a level of a transmission signal to have it satisfy a highest configured power requirement and then have the transmission signal enter the RRUs.

The step 507 is to set a Radio Frequency (RF) switch and to acquire an output dedicated training signal of the RRU-A over the feedback channel.

The step 508 is to adjust a level of the feedback signal to have it kept the same as that of the transmission signal.

The step 509 is to train the DPD coefficients.

The step 510 is to set an RF switch and to acquire an output dedicated training signal of the RRU-B over the feedback channel.

The step 511 is to adjust a level of the feedback signal to have it kept the same as that of the transmission signal.

The step 512 is to train the DPD coefficients.

In the case of multi-antenna, configuration, that is, the two channels of the RRU-A and the RRU-B, the step 507 to the step 508 can simply be repeated by setting an RF switch, acquiring the output dedicated training signal of the other RRU over the feedback channel and then training the DPD coefficients.

The step 513 is to update the DPD coefficients of the A and B channel respectively upon completion of training the coefficients.

The step 514 is to disable the feedback channels and the DPD training module and to return to the step 502.

The step 515 is to perform a pre-distortion process on the transmission signal.

Second Embodiment

Figure 6:
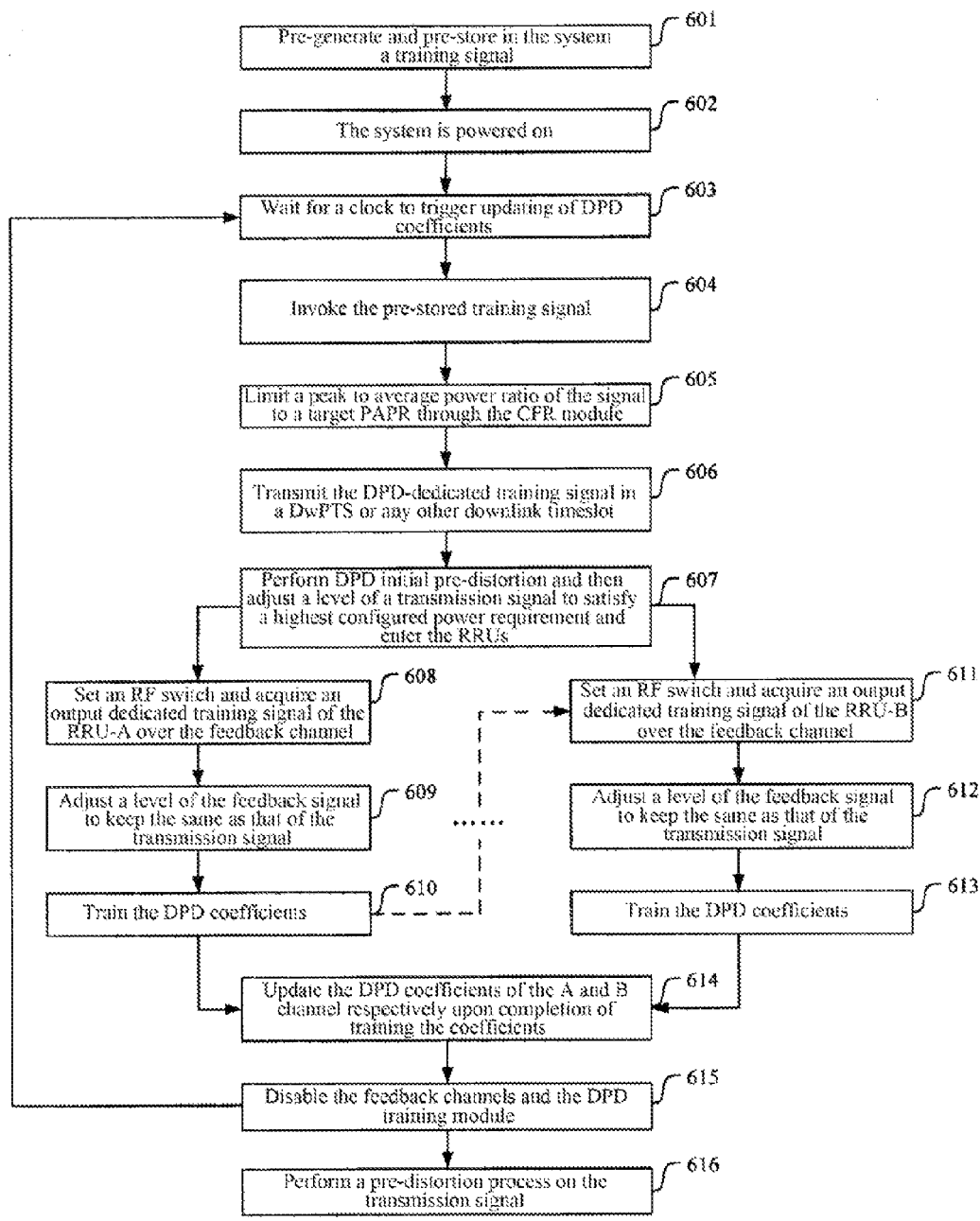
FIG. 6 is a schematic flow chart of performing a digital pre-distortion process according to a second embodiment of the invention.

FIG. 6 is a schematic flow chart of performing a digital pre-distortion process according to a second embodiment of the invention, and as illustrated, the process can include:

In the step 601, a training signal is pre-generated and pre-stored in the system.

In the step 602, the system is powered on.

The step 603 is to wait for a clock to trigger a function of updating DPD coefficients.

The step 604 is to invoke the pre-stored training signal.

The step 605 is to limit a Peak to Average Power Ratio of the training signal to a target PAPR through a CFR module. If the pre-stored training signal is a signal which has been processed in the step 605, then this step can be skipped.

The step 606 is to transmit the DPD-dedicated training signal, i.e., the training signal which has been processed in the step 605, in a DwPTS timeslot or any other normal downlink timeslot.

The step 607 is to perform an initial DPD, i.e., an initial pre-distortion process, then adjust a level of a transmission signal to have it satisfy a highest configured power requirement and then have the transmission signal enter the RRUs.

The step 608 is to set an RF switch and to acquire an output dedicated training signal of the RRU-A over the feedback channel.

The step 609 is to adjust a level of the feedback signal to have it kept the same as that of the transmission signal.

The step 610 is to train the DPD coefficients.

The step 611 is to set an RF switch and to acquire an output dedicated training signal of the RRU-B over the feedback channel.

The step 612 is to adjust a level of the feedback signal to have it kept the same as that of the transmission signal.

The step 613 is to train the DPD coefficients.

In the case of multi-antenna configuration, that is, the two channels of the RRU-A and the RRU-B, the step 608 to the step 610 can simply be repeated by setting an RF switch, acquiring the output dedicated training signal of the other RRU over the feedback channel and then training the DPD coefficients.

The step 614 is to update the DPD coefficients of the A and B channel respectively upon completion of training the coefficients.

The step 615 is to disable the feedback channels and the DPD training module and to return to the step 603.

The step 616 is to perform a pre-distortion process on the transmission signal.

In an implementation, the following requirements can further be imposed on the DPD training signal for a better effect:

1. The training signal is a signal at a high transmission power.

Since DPD improves the power efficiency of a radio frequency front end device by compensating nonlinearity of a power amplifier, a feedback signal (an RF PA output) shall be able to reflect well nonlinearity of the power amplifier. This requires the power of the transmission signal for training to be sufficiently high so that peak power thereof will be below or at a power point of P1 dB or below or at a power of P3 dB and even approach a saturation point of the power amplifier as required for the efficiency of the power amplifier.

2. The training signal is a signal with a high peak to average power ratio.

Since the feedback signal for training shall reflect nonlinearity of a power amplifier, this requires a peak to average power ratio of the signal to be consistent with a required peak to average power ratio of a power amplifier model and to include a sufficient number of distortion signal points undergoing nonlinear distortion of the power amplifier, which requires the training signal to be selected considering a varying sampling rate of a digital intermediate-frequency part, the training signal to be prevented from including a peak signal resulting from CFR leakage elimination and a segment of signal with a high peak to average power ratio to be selected as the training signal as possible.

3. A dynamic range of the training signal is made match that of the transmission signal.

Pre-distortion is intended for any transmission signal instead of large transmitted signal, and coefficients shall apply to the entire dynamic range of the transmission signal, so a dynamic range of the training signal shall match that of the transmission signal.

4. The DPD training signal is adjusted in power to eliminate fluctuation in transmission power of the training signal due to DPD.

Since the DPD training signal shall be adjusted correspondingly in power, fluctuation in transmission power of the training signal due to DPD shall be eliminated to the largest possible extent.

5. The feedback signal of the DPD training signal is adjusted in power to match a required input signal level of the ADC.

Since the feedback signal of the DPD training signal shall be adjusted correspondingly in power, it shall match a required input signal level of the ADC to maintain sufficient precision.

6. The feedback signal of the DPD training signal is calibrated to be synchronized with the transmission signal and to eliminate amplitude and phase distortion due to nonlinearity of a feedback radio frequency channel.

Since the feedback signal of the DPD training signal shall be calibrated correspondingly, it shall be ensured to be synchronized with the transmission signal while eliminating amplitude and phase distortion due to nonlinearity of a feedback radio frequency channel.

Furthermore in a specific implementation, the training signal can be transmitted in a DwPTS or in some of normal downlink timeslots or all normal downlink timeslots dedicated to transmission of the training signal.

Particularly in a TD-SCDMA system, a timeslot in which the training signal is transmitted can include a DwPTS and GP (guard period), or some of normal downlink timeslots or all normal downlink timeslots dedicated to transmission of the training signal.

That is, when the training signal is transmitted in a specific timeslot in a TD-SCDMA system, the specific timeslot can include special timeslots including a DwPTS and GP (guard period) or some of normal downlink timeslots or all normal downlink timeslots dedicated to transmission of reference signal.

Alternatively in an LTE-TDD system, a timeslot in which the training signal is transmitted can include a DwPTS and GP, or some of normal downlink timeslots or all normal downlink timeslots dedicated to transmission of the training signal.

That is, when the training signal is transmitted in a specific timeslot in an LTE-TDD system, the specific timeslot can include special timeslots including a DwPTS and GP (guard period) or some normal downlink timeslots or all normal downlink timeslots dedicated to transmission of the reference signal.

In an implementation, in order to acquire the output training signal of the radio frequency front-end device over the feedback channel, if the radio frequency front-end device includes a plurality of channels, then the same feedback channel can be time division-multiplexed for the plurality of channels to acquire the signal.

For details, reference can be made to the implementations in the first and second embodiments and also to the schematic diagram of FIG. 4.

A description of generating a dedicated training signal will be given below taking an example of a TD-SCDMA system and an LTE-TDD system.

1. A DPD training signal is generated in a TD-SCDMA system.

Figure 7:
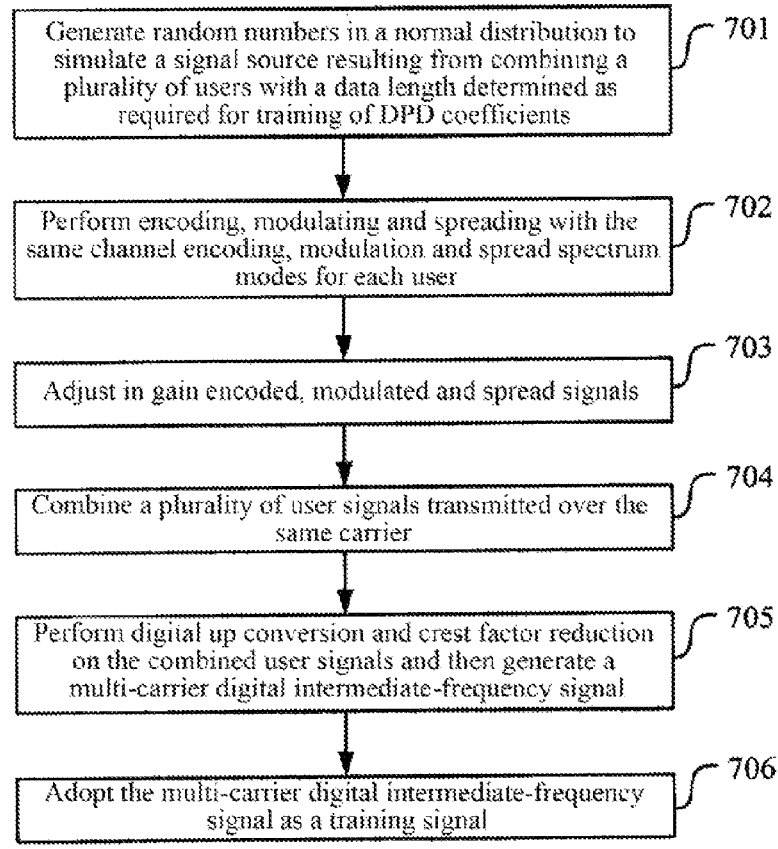
FIG. 7 is a schematic flow chart of generating a training signal in a TD-SCDMA system according to an embodiment of the invention.

FIG. 7 is a schematic flow chart of generating a training signal in a TD-SCDMA system, and as illustrated, a training signal can be generated in a TD-SCDMA system as follows:

The step 701 is to generate random numbers in a normal distribution to simulate a signal source resulting from combining a plurality of users with a data length determined as required for training of DPD coefficients;

The step 702 is to perform encoding, modulating and spreading with the same channel encoding, modulation and spreading modes for each user;

The step 703 is to adjust gain for encoded, modulated and spread signals, where a is a gain adjusting factor for combining the plurality of user signals and determined by the number of users and the number of code channels;

The step 704 is to combine the plurality of user signals transmitted over the same carrier;

The step 705 is to perform Digital Up Conversion (DUC) and Crest Factor Reduction (CFR) on the combined user signals and then generate a multi-carrier digital intermediate-frequency signal; and The step 706 is to adopt the multi-carrier digital intermediate-frequency signal as a training signal.

In an implementation, the training signal can be generated according to the largest number of carriers, the largest number of users and the highest order of modulation supported by the communication system.

Figure 8:
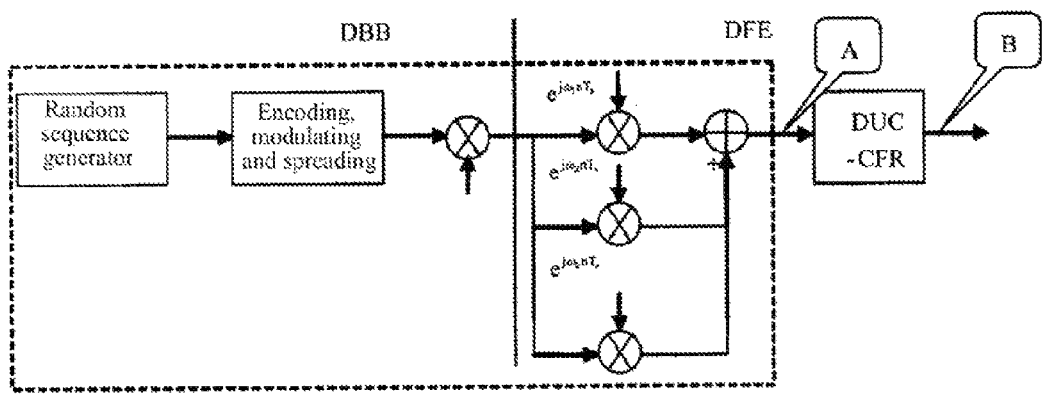
FIG. 8 is a schematic principle diagram of generating a DPD training sequence in a TD-SCDMA system according to an embodiment of the invention.

FIG. 8 is a schematic principle diagram of generating a DPD training sequence in a TD-SCDMA system. As illustrated, in a Digital Base Band (DBB or also referred to as BB), a random sequence generator generates random numbers 0/1 in a normal distribution to simulate a signal source resulting from combining a plurality of users with a data length determined as required for DPD training; the same channel encoding, modulation and spreading modes are adopted for each user/code channel; $\alpha$ is a gain adjusting factor for combining of a plurality of user/code channel signals and determined by the number of users/code channels; and the same base band signal source is adopted for different carriers in a Digital Front-End (DFE). Particularly for $e^{j\omega_1 nT_s}, e^{j\omega_2 nT_s}, \ldots, e^{j\omega_K nT_s}$, K is the largest number of carriers, where $e^{j\omega_2 nT_s}$ is primarily intended for phase rotation of different user signals to lower the peak to average power ratio of a transmission signal, $\omega_i$ represents a representation form of an angular frequency corresponding to the $i^{th}$ carrier, n represents a sampling point, and $T_s$ represents a sampling interval.

In an implementation, a training signal with the following characteristics can be adopted:

A possible largest number of carriers, e.g., 9/12 carriers;

A possible largest number of transmitted code channels, e.g., 16 code channels; and A possible highest order of modulation, e.g., 64QAM.

The length of the signal depends upon the design of an algorithm so long as in principle a sufficient number of points are included to describe PA distortion.

When these conditions are satisfied, the digital signal shall be transmitted at the highest power in a practical application, and a radio frequency front-end device can determine from a transformation relationship of the signal from a base band to an antenna port that final RF output power is sure to also be the highest.

Since DPD training can be performed offline and the training signal can be repeated, the part of generating the training signal as illustrated in the dotted line in FIG. 8 can operate offline to generate the required signal, and either the signal at the point A resulting from combining a plurality of carriers or the digital intermediate-frequency signal at the point B can be taken as a DPD training signal dependent upon an implementation of the system, and in a specific implementation, can be stored in a Read Only Memory (ROM) of the DFE unit.

2. A DPD training signal is generated in an LTE-TDD system.

Figure 9:
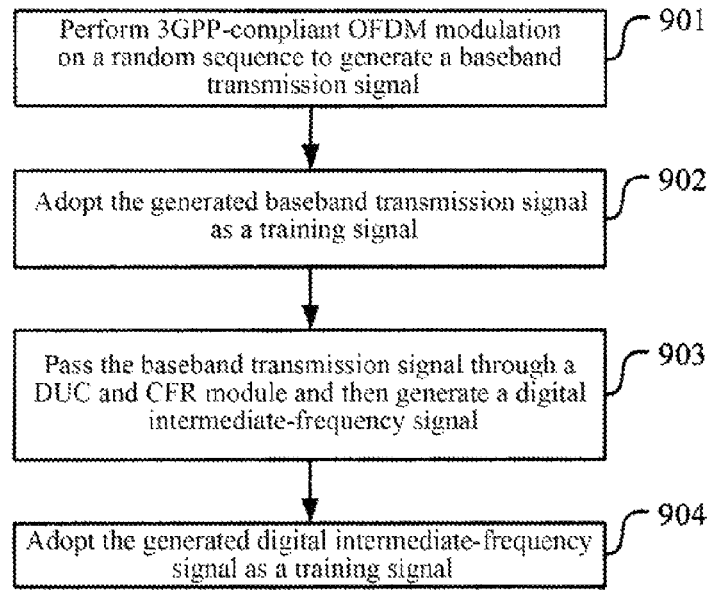
FIG. 9 is a schematic flow chart of generating a training signal in an LTE-TDD system according to an embodiment of the invention.

FIG. 9 is a schematic flow chart of generating a training signal in an LTE-TDD system, and as illustrated, a training signal can be generated in an LTE-TDD system as follows:

The step 901 is to perform 3GPP-compliant Orthogonal Frequency Division Multiplexing (OFDM) modulation on a random sequence to generate a baseband transmission signal;

The step 902 is to adopt the generated baseband transmission signal as a training signal;

The step 903 is to pass the baseband transmission signal through a Digital Up Conversion and CFR module and then generate a digital intermediate-frequency signal; and The step 904 is to adopt the generated digital intermediate-frequency signal as a training signal.

Figure 10:
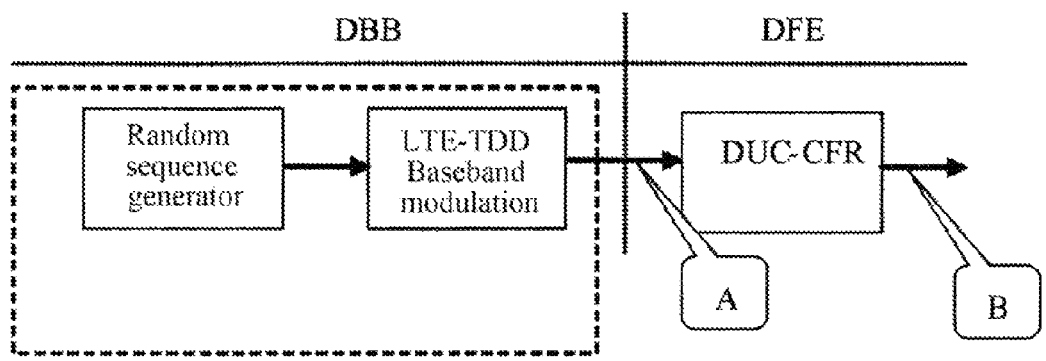
FIG. 10 is a schematic principle diagram of generating a DPD training sequence in an LTE-TDD system according to an embodiment of the invention.

FIG. 10 is a schematic principle diagram of generating a DPD training sequence in an LTE-TDD system according to an embodiment of the invention. As illustrated, a random sequence undergoes 3GPP-compliant OFDM modulation to generate a standard baseband transmission signal (at the point A) with the following characteristics and then the baseband transmission signal passes a Digital Up Conversion (DUG) and CFR module to generate a digital intermediate-frequency signal (at the point B). The signal at either the point A or the point B can be taken as a DPD training signal dependent upon an implementation of the system, and since DPD training can be performed offline, the signal can be stored in an ROM of the DFE unit.

The characteristics refer to that a sufficient number of Physical Resource Blocks (PRBs) are adopted; all of the PRBs are occupied to the largest possible extent; and the modulation mode of QPSK or 16QAM or 64QAM is adopted.

Based upon the same inventive idea, an embodiment of the invention further provides a digital pre-distortion processing apparatus, and since the apparatus address the problem under a similar principle to the digital pre-distortion processing method, reference can be made to the implementation of the method for an implementation of the apparatus, and a repeated description thereof will be omitted here.

Figure 11:
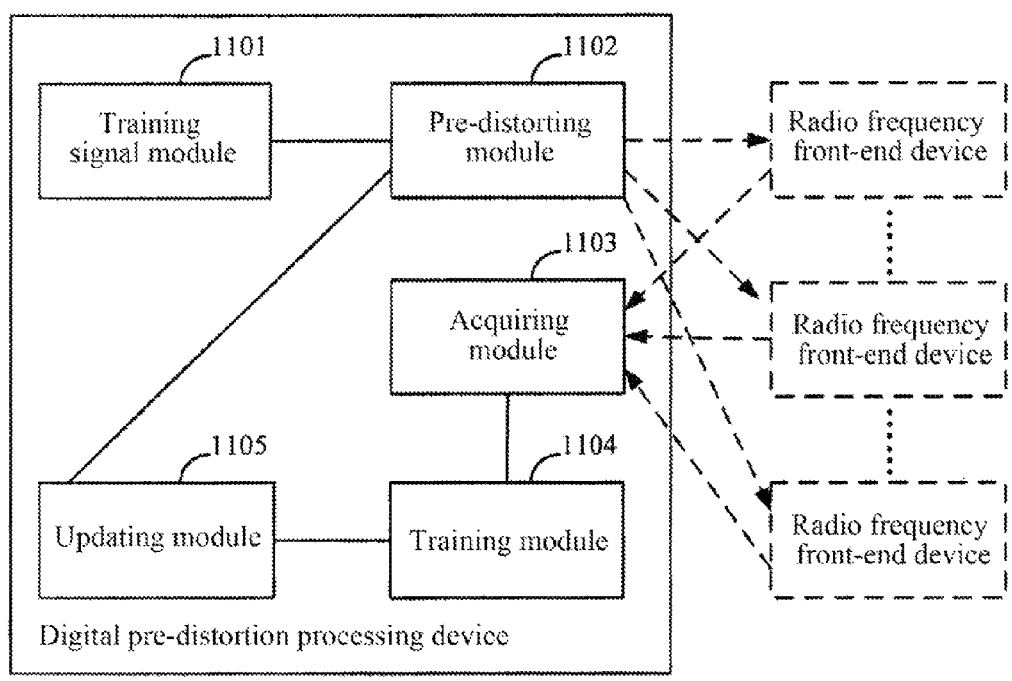
FIG. 11 is a schematic structural diagram of a digital pre-distortion processing apparatus according to an embodiment of the invention.

FIG. 11 is a schematic structural diagram of the digital pre-distortion processing apparatus, and as illustrated, the apparatus can include:

A training signal module 1101 configured to transmit a training signal into at least one radio frequency front-end device as needed;

An acquiring module 1103 configured to acquire the output training signal of the radio frequency front-end device over a feedback channel as needed;

A training module 1104 configured to train DPD coefficients of the radio frequency front-end device; and An updating module 1105 configured to update the DPD coefficients of the corresponding radio frequency front-end device as needed upon completion of updating the coefficients.

Furthermore in an implementation, a pre-distorting module 1102 can further be included and configured to perform an initial pre-distortion process on the training signal and then to transmit the processed training signal into the at least one radio frequency front-end device.

In an implementation, the training signal module can further be configured to adopt a training signal pre-generated and pre-stored in a communication system.

In an implementation, the training signal module can further be configured to transmit the training signal as needed or periodically or non-periodically.

In an implementation, the radio frequency front-end device can further include a single radio frequency channel or a plurality of radio frequency channels or a set of a plurality of RRUs.

In an implementation, each radio frequency channel can further include a power amplifier device.

In an implementation, the training signal module can further be configured to adopt a signal at a high transmission power and with a high peak to average power ratio as the training signal.

In an implementation, the training signal module can further be configured to transmit the training signal by transmitting the training signal in a DwPTS or in some normal downlink timeslots or all normal downlink timeslots dedicated to transmission of the training signal.

In an implementation, the training signal module can further include a first transmitting unit and/or a second transmitting unit, where:

The first transmitting unit is configured to transmit the training signal in a timeslot including a DwPTS and GP (Guard Period), or some normal downlink timeslots or all normal downlink timeslots dedicated to transmission of the training signal in a TD-SCDMA system; and The second transmitting unit is configured to transmit the training signal in a timeslot including a DwPTS and Guard period, or some normal downlink timeslots or all normal downlink timeslots dedicated to transmission of the training signal in an LTE-TDD system.

In an implementation, the apparatus can further include one of the following modules or a combination thereof:

A matching module configured to match a dynamic range of the training signal with that of a transmission signal.

A power adjusting module configured to adjust in power the DPD training signal to eliminate fluctuation in transmission power of the training signal.

A feedback signal power adjusting module configured to adjust in power a feedback signal of the DPD training signal to match a required input signal level of an ADC; and A calibrating module configured to calibrate the feedback signal of the DPD training signal to have it synchronized with the transmission signal and to eliminate amplitude and phase distortion due to nonlinearity of the feedback radio frequency channel.

Figure 12:
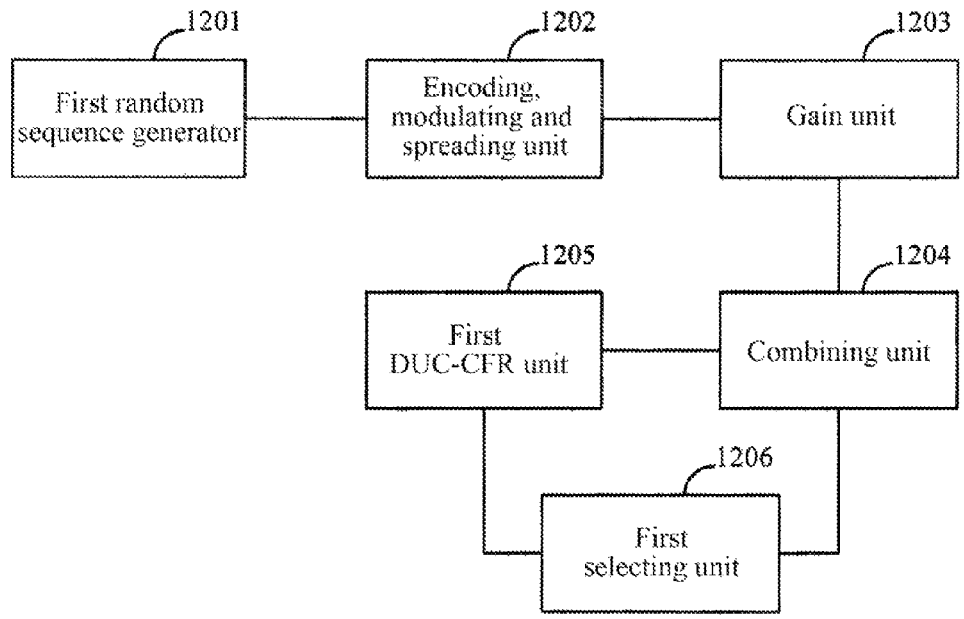
FIG. 12 is a schematic structural diagram of a training signal module in a TD-SCDMA system according to an embodiment of the invention.

FIG. 12 is a schematic structural diagram of the training signal module in a TD-SCDMA system according to an embodiment of the invention.

A first random sequence generator 1201 is configured to generate random numbers in a normal distribution to simulate a signal source resulting from combining a plurality of users with a data length determined as required for training of the DPD coefficients;

An encoding, modulating and spreading unit 1202 is configured to perform encoding, modulating and spreading with the same channel encoding, modulation and spread spectrum modes for each user;

A gain unit 1203 is configured to adjust gain for encoded, modulated and spread signals, where α is a gain adjusting factor for combining the plurality of user signals and determined by the number of users and the number of code channels;

A combining unit 1204 is configured to combine the plurality of user signals transmitted over the same carrier;

A first DUC-CFR unit 1205 is configured to perform digital up conversion and crest factor reduction on the combined user signals and then generate a multi-carrier digital intermediate-frequency signal; and A first selecting unit 1206 is configured to adopt the multi-carrier digital intermediate-frequency signal as the training signal.

In an implementation, the training signal module can further be configured to generate the training signal according to the largest number of carriers, the largest number of users and the highest order of modulation supported by a communication system.

Figure 13:
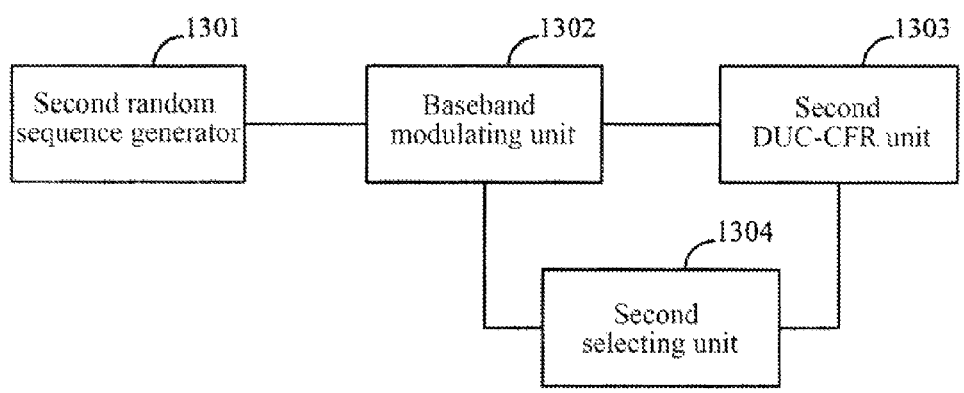
FIG. 13 is a schematic structural diagram of a training signal module in an LTE-TDD system according to an embodiment of the invention.

FIG. 13 is a schematic structural diagram of the training signal module in an LTE-TDD system according to an embodiment of the invention.

A second random sequence generating unit 1301 is configured to generate a random sequence;

A baseband modulating unit 1302 is configured to perform 3GPP-compliant OFDM modulation on the random sequence to generate a baseband transmission signal and to adopt the generated baseband transmission signal as the training signal;

A second DUC-CFR unit 1303 is configured to perform DUG and CFR on the baseband transmission signal to generate a digital intermediate-frequency signal; and A second selecting unit 1304 is configured to adopt the generated digital intermediate-frequency signal as the training signal.

In an implementation, the acquiring module 1103 can further be configured to acquire the output training signal of the radio frequency front-end device over the feedback channel as needed by acquiring the signal through time division-multiplexing the same feedback channel for a plurality of channels if the radio frequency front-end device includes the plurality of channels.

In an implementation, the pre-distorting module 1102 can further be configured to perform a pre-distortion process with the updated DPD coefficients on a transmission signal on the radio frequency front-end device as needed.

For the convenience of a description, the respective components of the foregoing apparatus have been described respectively by functionally dividing them into respective modules or units. Of course the functions of the respective modules or units can be performed in the same one or a plurality of items of software or hardware to put the invention into practice.

As can be apparent from the foregoing embodiments, in the technical solution of the invention, a specific training signal is transmitted periodically to train digital pre-distortion coefficients, and since the training signal is transmitted periodically, no real time operation is required, and it is not necessary to track a change in the signal all the time and to compare it with a signal template resulting from a long-term statistic to trigger training.

Furthermore there is further provided a timeslot in which the training signal is transmitted in a TD-SCDMA system and an LTE-TDD system, that is, the training signal is transmitted in a specific timeslot in a TD-SCDMA system, and the specific timeslot includes a special timeslot of DwPTS and GP, or some of normal downlink timeslots or all normal downlink timeslots dedicated to transmission of the reference signal; and the training signal is transmitted in a specific timeslot in an LTE-TDD system, and the specific timeslot includes a special timeslot of DwPTS and GP, or some of normal downlink timeslots or all normal downlink timeslots dedicated to transmission of reference signal.

Furthermore there is further provided a specific criterion under which the training signal is selected, that is, the specific reference signal has the apparent characteristics of high transmission power and a high peak to average power ratio.

Furthermore with the use of a plurality of antennas, the same feedback channel can be time division-multiplexed for a plurality of channels to train digital pre-distortion coefficients.

Furthermore characteristics of a DPD training signal are further provided for convenience of an implementation.

In summary the technical solution of the invention apparently has at least one or more of the following advantages:

(1) It is easy to implement with good performance;

(2) An optimum training sequence can be customized dependent upon the characteristic of a system;

(3) It complies with the characteristic of a TDD system application;

(4) It is suitable for a multi-antenna application of TD-SCDMA or LTE-TDD;

(5) It is suitable for a multi-band networking application of TD-SCDMA; and (6) It is suitable for a common-platform application of TD-SCDMA and LTE-TDD.

Furthermore if future introduction of the technology of Radio over Fiber (RoF) to a radio communication is considered, then the technical solution according to the embodiments of the invention can further support an application scenario of a plurality of radio frequency front end devices (e.g., RRUs, etc.) concatenated in various forms (e.g., star, chain, loop, etc.) to thereby simplify a cost of implementing a system in a DPD application.

Those skilled in the art shall appreciate that the embodiments of the invention can be embodied as a method, a system or a computer program product. Therefore the invention can be embodied in the form of an all-hardware embodiment, an all-software embodiment or an embodiment of software and hardware in combination. Furthermore the invention can be embodied in the form of a computer program product embodied in one or more computer useable storage mediums (including but not limited to a disk memory, a CD-ROM, an optical memory, etc.) in which computer useable program codes are contained.

The invention has been described in a flow chart and/or a block diagram of the method, the device (system) and the computer program product according to the embodiments of the invention. It shall be appreciated that respective flows and/or blocks in the flow chart and/or the block diagram and combinations of the flows and/or the blocks in the flow chart and/or the block diagram can be embodied in computer program instructions. These computer program instructions can be loaded onto a general-purpose computer, a specific-purpose computer, an embedded processor or a processor of another programmable data processing device to produce a machine so that the instructions executed on the computer or the processor of the other programmable data processing device create means for performing the functions specified in the flow(s) of the flow chart and/or the block(s) of the block diagram.

These computer program instructions can also be stored into a computer readable memory capable of directing the computer or the other programmable data processing device to operate in a specific manner so that the instructions stored in the computer readable memory create an article of manufacture including instruction means which perform the functions specified in the flow(s) of the flow chart and/or the block(s) of the block diagram.

These computer program instructions can also be loaded onto the computer or the other programmable data processing device so that a series of operational steps are performed on the computer or the other programmable data processing device to create a computer implemented process so that the instructions executed on the computer or the other programmable device provide steps for performing the functions specified in the flow(s) of the flow chart and/or the block(s) of the block diagram.

Although the preferred embodiments of the invention have been described, those skilled in the art benefiting from the underlying inventive concept can make additional modifications and variations to these embodiments. Therefore the appended claims are intended to be construed as encompassing the preferred embodiments and all the modifications and variations coming into the scope of the invention.

Evidently those skilled in the art can make various modifications and variations to the invention without departing from the spirit and scope of the invention. Thus the invention is also intended to encompass these modifications and variations thereto so long as the modifications and variations come into the scope of the claims appended to the invention and their equivalents.

The invention claimed is:

1. A Digital Pre-Distortion (DPD), processing method in a Time Division-Synchronization Code Division Multiple Access (TD-SCDMA) system or in a Lone Term Evolution-Time Division Duplex (LTE-TDD) system, comprising the steps of:

transmitting a training signal into at least one radio frequency front-end device;
acquiring the output training signal of the radio frequency front-end device over a feedback channel;
training DPD coefficients of the radio frequency front-end device; and
updating the DPD coefficients of the corresponding radio frequency front-end device upon completion of training the DPD coefficients;
wherein, in the TD-SCDMA system, the training signal is generated by:
generating random numbers in a normal distribution to simulate a signal source resulting from combining a plurality of users with a data length determined as required for training of the DPD coefficients;
performing encoding, modulating and spreading with the same channel encoding, modulation and spread spectrum modes for each user;
adjusting in gain encoded, modulated and spread signals;
combining a plurality of user signals transmitted over the same carrier;
performing Digital Up Conversion, DUC, and Crest Factor Reduction, CFR, on the combined user signals and then generating a multi-carrier digital intermediate-frequency signal; and
adopting the multi-carrier digital intermediate-frequency signal as the training signal
or wherein,
in the LTE-TDD system, the training signal is generated by:
performing 3GPP-compliant Orthogonal Frequency Division Multiplexing (OFDM) modulation on a random sequence and then generating a baseband transmission signal;
performing Digital Up Conversion (DUC) and Crest Factor Reduction (CFR) on the baseband transmission signal to generate a digital intermediate-frequency signal; and
adopting the generated baseband transmission signal or the generated digital intermediate-frequency signal as the training signal.

2. The method according to claim 1, wherein in the TD-SCDMA system, the training signal is generated according to the largest number of carriers, the largest number of users and the highest order of modulation supported by the TD-SCDMA system.

3. The method according to claim 1, wherein the training signal is pre-generated and pre-stored in the system.

4. The method according to claim 1, wherein the training signal is transmitted in one of the following manners: as needed, periodically, or non-periodically.

5. The method according to claim 1, further comprising:
performing an initial pre-distortion process on the training signal which is then transmitted.

6. The method according to claim 1, wherein the radio frequency front-end device comprises a single radio frequency channel, a set of a plurality of radio frequency channels or a set of a plurality of Radio Remote Units (RRUs), wherein each radio frequency channel comprises a power amplifier device.

7. The method according to claim 1, wherein the training signal is a signal at a high transmission power and with a high peak to average power ratio.

8. The method according to claim 1, wherein the training signal is transmitted in a Downlink Pilot Time Slot (DwPTS) and one or more of: Guard Period (GP), in some of normal downlink timeslots, all normal downlink timeslots dedicated to transmission of the training signal in a Time Division-Synchronization Code Division Multiple Access (TD-SCDMA) system, or in a Long Term Evolution-Time Division Duplex (LTE-TDD) system.

9. The method according to claim 1, further comprising one or a combination of the steps of:
matching a dynamic range of the training signal with that of a transmission signal;
adjusting in power a DPD training signal to eliminate fluctuation in transmission power of the training signal due to DPD;
adjusting in power a feedback signal of the DPD training signal to match a required input signal level of an Analogue-to-Digital Converter, ADC; and
calibrating the feedback signal of the DPD training signal to have it synchronized with the transmission signal and to eliminate amplitude and phase distortion due to non-linearity of a feedback radio frequency channel.

10. The method according to claim 1, wherein the output training signal of the radio frequency front-end device is acquired over the feedback channel by acquiring the signal through time division-multiplexing the same feedback channel for a plurality of channels if the radio frequency front-end device includes the plurality of channels.

11. The method according to claim 1, further comprising:
performing a pre-distortion process with the updated DPD coefficients on a transmission signal on the radio frequency front-end device.

12. A digital pre-distortion processing apparatus in a Time Division-Synchronization Code Division Multiple Access (TD-SCDMA) system or in a Lone Term Evolution-Time Division Duplex (LTE-TDD) system, comprising:
a training signal module configured to transmit a training signal into at least one radio frequency front-end device;
an acquiring module configured to acquire the output training signal of the radio frequency front-end device over a feedback channel;
a training module configured to train DPD coefficients of the radio frequency front-end device; and
an updating module configured to update the DPD coefficients of the corresponding radio frequency front-end device upon completion of updating the coefficients;
wherein in the TD-SCDMA system, the training signal module when generating the training signal comprises:
a first random sequence generator configured to generate random numbers in a normal distribution to simulate a signal source resulting from combining a plurality of users;
an encoding, modulating and spreading unit configured to perform encoding, modulating and spreading with the same channel encoding, modulation and spread spectrum modes for each user;
a gain unit configured to adjust in gain encoded, modulated and spread signals;
a combining unit configured to combine a plurality of user signals transmitted over the same carrier;
a first DUC-CFR unit configured to perform digital up conversion and crest factor reduction on the combined user signals to generate a multi-carrier digital intermediate-frequency signal; and
a first selecting unit configured to adopt the multi-carrier digital intermediate-frequency signal resulting from combining as the training signal
or, wherein
in the LTE-TDD system, the training signal module when generating the training signal comprises:
a second random sequence generating unit configured to generate a random sequence;
a baseband modulating unit configured to perform 3GPP-compliant OFDM modulation on the random sequence to generate a baseband transmission signal;
a second DUC-CFR unit configured to perform DUC and CFR on the baseband transmission signal to generate a digital intermediate-frequency signal; and
a second selecting unit configured to adopt the generated baseband transmission signal or the generated digital intermediate-frequency signal as the training signal.

13. The apparatus according to claim 12, wherein in the TD-SCDMA system the training signal module is further configured to generate the training signal according to the largest number of carriers, the largest number of users and the highest order of modulation supported by the TD-SCDMA system.

14. The apparatus according to claim 12, wherein the training signal module is further configured to adopt a training signal pre-generated and pre-stored in the system, to transmit the training signal in one or more of the following manners: as needed, periodically, or non-periodically, and to adopt a signal at high transmission power and with a high peak to average power ratio as the training signal.

15. The apparatus according to claim 12, further comprising:
a pre-distorting module configured to perform an initial pre-distortion process on the training signal transmitted from the training signal module, which is then transmitted into the at least one radio frequency front-end device.

16. The apparatus according to claim 12, wherein the radio frequency front-end device comprises a single radio frequency channel, a plurality of radio frequency channels or a set of a plurality of RRUs, wherein each radio frequency channel comprises a power amplifier device.

17. The apparatus according to claim 12, wherein the training signal module is further configured to transmit the training signal in one or more of the following: a Downlink Pilot Time Slot (DwPTS) and Guard Period (GP), in some normal downlink timeslots, all normal downlink timeslots dedicated to transmission of the entire training signal in a Time Division-Synchronization Code Division Multiple Access (TD-SCDMA) system, or in a Long Term Evolution-Time Division Duplex (LTE-TDD) system.

18. The apparatus according to claim 12, further comprising one or a combination of the following modules:
a matching module configured to match a dynamic range of the training signal with that of a transmission signal;
a power adjusting module configured to adjust in power a DPD training signal;
a feedback signal power adjusting module configured to adjust in power a feedback signal of the DPD training signal; and
a calibrating module configured to calibrate the feedback signal of the DPD training signal.

19. The apparatus according to claim 12, wherein the acquiring module is further configured to acquire the output training signal of the radio frequency front-end device over the feedback channel as needed by acquiring the signal through time division-multiplexing the same feedback channel for a plurality of channels if the radio frequency front-end device comprises the plurality of channels.

20. The apparatus according to claim 12, wherein the pre-distorting module is further configured to perform a pre-distortion process with the updated DPD coefficients on a transmission signal on the radio frequency front-end device.

* * * * *